United States Patent
Otremba et al.

(10) Patent No.: US 9,437,516 B2
(45) Date of Patent: Sep. 6, 2016

(54) CHIP-EMBEDDED PACKAGES WITH BACKSIDE DIE CONNECTION

(71) Applicant: Infineon Technologies Austria AG, Villach (AT)

(72) Inventors: Ralf Otremba, Kaufbeuren (DE); Josef Höglauer, Heimstetten (DE); Manfred Schindler, Regensburg (DE); Johannes Lodermeyer, Regensburg (DE); Thorsten Scharf, Regensburg (DE)

(73) Assignee: Infineon Technologies Austria AG, Villach (AT)

( * ) Notice: Subject to any disclaimer, the term of this patent is extended or adjusted under 35 U.S.C. 154(b) by 114 days.

(21) Appl. No.: 14/149,392

(22) Filed: Jan. 7, 2014

(65) Prior Publication Data

US 2015/0194362 A1 Jul. 9, 2015

(51) Int. Cl.
| | |
|---|---|
| *H01L 23/00* | (2006.01) |
| *H01L 23/367* | (2006.01) |
| *H01L 23/495* | (2006.01) |
| *H01L 23/492* | (2006.01) |
| *H01L 23/538* | (2006.01) |
| *H01L 21/48* | (2006.01) |

(52) U.S. Cl.
CPC .......... *H01L 23/367* (2013.01); *H01L 23/492* (2013.01); *H01L 23/49517* (2013.01); *H01L 23/5389* (2013.01); *H01L 24/18* (2013.01); *H01L 24/20* (2013.01); *H01L 24/36* (2013.01); *H01L 24/40* (2013.01); *H01L 24/71* (2013.01); *H01L 21/4857* (2013.01); *H01L 24/34* (2013.01); *H01L 24/37* (2013.01); *H01L 24/39* (2013.01); *H01L 24/77* (2013.01); *H01L 24/84* (2013.01); *H01L 2224/211* (2013.01); *H01L 2224/40225* (2013.01); *H01L 2924/12042* (2013.01); *H01L 2924/181* (2013.01)

(58) Field of Classification Search
CPC ....... H01L 24/34; H01L 24/36; H01L 24/37; H01L 24/38; H01L 24/39; H01L 24/40; H01L 24/41; H01L 24/77; H01L 24/84
See application file for complete search history.

(56) References Cited

U.S. PATENT DOCUMENTS

| | | |
|---|---|---|
| 7,759,777 B2 | 7/2010 | Otremba et al. |
| 7,807,504 B2 | 10/2010 | Otremba et al. |
| 7,879,652 B2 | 2/2011 | Otremba et al. |

(Continued)

FOREIGN PATENT DOCUMENTS

| | | | |
|---|---|---|---|
| DE | EP 0677985 A1 * | 10/1995 | ............ B23K 26/04 |
| DE | 102007017831 A1 | 10/2008 | |
| DE | 102008034164 A1 | 3/2009 | |
| TW | 201123366 A | 7/2011 | |

*Primary Examiner* — David Zarneke

(74) *Attorney, Agent, or Firm* — Murphy, Bilak & Homiller, PLLC

(57) ABSTRACT

A semiconductor package includes a semiconductor die and a metal clip. In one embodiment, the semiconductor die is embedded in an insulating material and has a first surface facing in a first direction, a second surface facing in a second direction opposite the first direction and an edge extending between the first and second surfaces. The metal clip is embedded in the insulating material above the die and bonded to the second surface of the die. Part of the metal clip extends laterally beyond the edge of the die and vertically in the first direction to provide galvanic redistribution at the second surface of the die. Other embodiments of semiconductor packages are also provided.

20 Claims, 8 Drawing Sheets

(56) References Cited

U.S. PATENT DOCUMENTS

| | | |
|---|---|---|
| 8,030,131 B2 | 10/2011 | Otremba et al. |
| 8,084,816 B2 | 12/2011 | Otremba et al. |
| 8,884,343 B2* | 11/2014 | Lange .................. H01L 21/50 257/288 |
| 2003/0089983 A1* | 5/2003 | Huang ............... H01L 23/3128 257/738 |
| 2004/0061221 A1* | 4/2004 | Schaffer ................ H01L 24/36 257/723 |
| 2005/0029651 A1* | 2/2005 | Tomioka ............ H01L 23/3121 257/712 |
| 2009/0289354 A1* | 11/2009 | Landau ................ H01L 23/142 257/723 |
| 2010/0127383 A1* | 5/2010 | Oka ........................ H01L 24/40 257/692 |
| 2012/0218318 A1* | 8/2012 | Hirao .................... H01L 24/34 345/690 |
| 2013/0127031 A1 | 5/2013 | Hosseini et al. |
| 2013/0256856 A1* | 10/2013 | Mahler ............ H01L 21/76816 257/676 |
| 2013/0328180 A1* | 12/2013 | Salamone ........... H01L 23/4334 257/675 |
| 2015/0061003 A1* | 3/2015 | Zundel ............... H01L 29/7397 257/334 |
| 2015/0130036 A1* | 5/2015 | Cho .................. H01L 23/49548 257/675 |
| 2015/0155267 A1* | 6/2015 | Hoegerl ............. H01L 25/0655 257/698 |

* cited by examiner

CHIP-EMBEDDED PACKAGES WITH BACKSIDE DIE CONNECTION

TECHNICAL FIELD

The instant application relates to semiconductor packages, and more particularly to contacting the backside of semiconductor chips embedded in packages.

BACKGROUND

Embedded-chip packaging is a semiconductor chip (die) packaging technology where materials are added to a printed circuit structure to create optional passive elements such as resistors and capacitors, and active chips (dies) are placed on an internal layer and then buried as additional layers are added. For example some embedded-chip processes include die placement with non-conductive paste attach to a pre-patterned Cu foil, lamination of standard glass reinforced, prepreg (pre-impregnated composite fibers where a matrix material, such as epoxy, is already present) for dimensional stability, and Cu foil patterning to realize PCB (printed circuit board) routing layers. Typical laminate structures can be two to six layers with more complex structures being up to ten metal layers. Standard packaging processes such as wire or clip bonding, as well as common molding techniques, are typically replaced with galvanic processes. The results are a significantly reduced package footprint, package resistance and inductance, as well as low thermal resistance. However, it would be desirable to optimize embedded-chip packaging technologies for multi-chip assemblies so that the embedded-chip packaging technologies are adapted and expanded to meet the needs of different chip technologies e.g. such as high power contacts for power semiconductor dies and dies of different thickness embedded in the same package.

SUMMARY

According to an embodiment of a semiconductor package, the package comprises a semiconductor die embedded in an insulating material. The die has a first surface facing in a first direction, a second surface facing in a second direction opposite the first direction and an edge extending between the first and second surfaces. The semiconductor package further comprises a metal clip embedded in the insulating material above the die and bonded to the second surface of the die. Part of the metal clip extends laterally beyond the edge of the die and vertically in the first direction to provide galvanic redistribution at the second surface of the die.

According to another embodiment of a semiconductor package, the package comprises a semiconductor die embedded in an insulating material. The die has opposing first and second surfaces and an edge extending between the first and second surfaces. The package further comprises a structured metal redistribution layer disposed in the insulating material below the die, first conductive vias connecting the structured metal redistribution layer to terminals at the first surface of the die, and a first metal component embedded in the insulating material above the die and bonded to the second surface of the die. Part of the first metal component extends laterally beyond the edge of the die. The package also includes second conductive vias extending vertically from the structured metal redistribution layer toward the first metal component and terminating prior to the first metal component so that a gap exists between the second conductive vias and the part of the first metal component extending laterally beyond the edge of the die. The package further comprises a second metal component disposed in the gap and connecting the second conductive vias to the part of the first metal component extending laterally beyond the edge of the die.

According to yet another embodiment of a semiconductor package, the package comprises a semiconductor die embedded in an insulating material. The die has opposing first and second surfaces and an edge extending between the first and second surfaces. The package further comprises a first metal component embedded in the insulating material above the die and bonded to the second surface of the die. Part of the first metal component extends laterally beyond the edge of the die. The package also comprises a second metal component disposed under and connected to the part of the first metal component that extends laterally beyond the edge of the die. The second metal component vertically extends through the insulating material so that part of the second metal component is uncovered by the insulating material at a side of the package facing away from the second surface of the die. The first and second metal components form at least a thermal pathway from the second surface of the die to the side of the package facing away from the second surface of the die.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

According to an embodiment described herein, an embedded-chip package is provided that includes additional rewiring and/or contact elements in the form of a metal clip for contacting the backside of an embedded semiconductor die. According to additional embodiments described herein, embedded-chip packages are provided with backside rewiring and/or contact elements for thick semiconductor dies or semiconductor dies of different thicknesses embedded in the same package.

Figure 1:
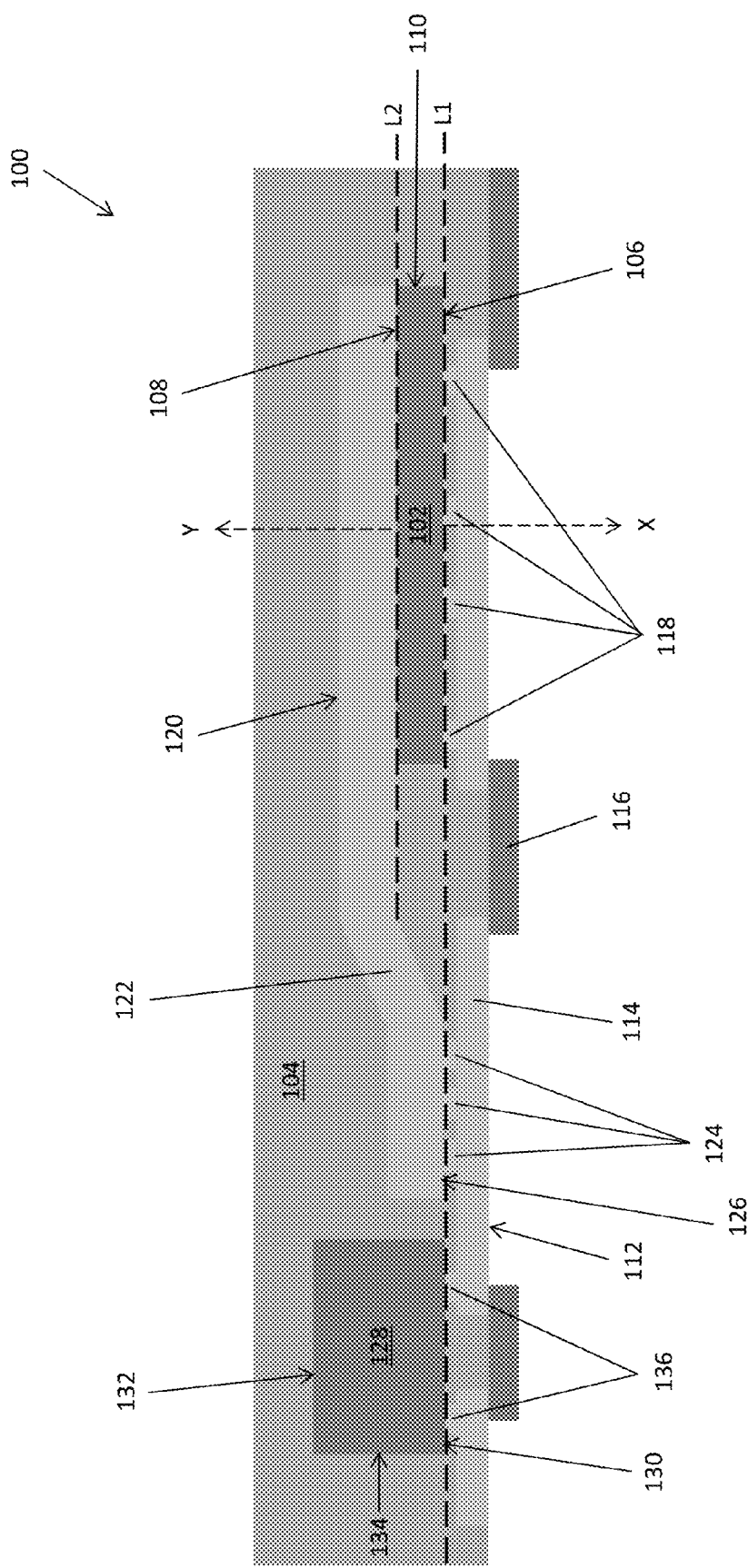
FIG. 1 illustrates a cross-sectional view of an embodiment of a chip-embedded semiconductor package.

FIG. 1 illustrates an embodiment of an embedded-chip package 100. The package 100 comprises a first semiconductor die 102 embedded in an insulating material 104. In one embodiment, the insulating material 104 is a laminate such as standard PCB material or standard FR4 (fiberglass reinforced epoxy laminate) material. In another embodiment, the insulating material 104 is a molding compound. Any standard chip lamination or molding process can be used to form the insulating material 104. For example in the case of a laminate, the process can include diffusion soldering of the first die 102, lamination of RCC (resin-coated-copper) on the assembled die 102 to form a polymer dielectric matrix, laser drilling of vias in the insulating material 104, and via filling by electroplating of copper. In the case of molding, a molding compound is preheated prior to loading into a molding chamber. After pre-heating, the molding compound is forced by a hydraulic plunger into a pot where it reaches melting temperature and becomes fluid. The plunger then continues to force the fluid molding compound into runners of a mold chase. These runners serve as canals where the fluid molding compound travels until it reaches the cavities, which contain the objects for encapsulation. In each case, the first die 102 embedded in the insulating material 104 has a first surface 106 facing in a first direction (X), a second surface 108 facing in a second direction (Y) opposite the first direction and an edge 110 extending between the first and second surfaces 106, 108.

The package 100 further comprises a structured metal redistribution layer (RDL) 112 disposed in the insulating material 104 below the first die 102. The structured metal redistribution layer 112 is defined by the addition of metal and dielectric layers 114, 116 onto the surface of a wafer or carrier to re-route the I/O (input/output) layout into a new, looser pitch footprint. Such redistribution utilizes thin film polymers 116 such as BCB, (benzocyclobutene), polyimide, Asahi Glass ALX, etc. and metallization 114 such Al or Cu to reroute the peripheral pads to an area array configuration. The redistribution trace can be fabricated directly on a primary passivation such as SiN or SiON, or can be routed over a second layer of polymer to add additional compliancy. One or more additional metal (and corresponding dielectric layers) can be connected to the structured metal redistribution layer 112 to facilitate connection to a board or other component. Such material layers are not shown in FIG. 1 for ease of illustration.

The package 100 also comprises first conductive vias 118 that connect the structured metal redistribution layer 112 to terminals at the first surface 106 of the first die 102. These terminals are not shown in FIG. 1 for ease of illustration. The first conductive vias 118 can be formed as part of any standard RDL process.

A metal clip (also commonly referred to as a metal strap in the semiconductor packaging arts) 120 is embedded in the insulating material 104 above the first die 102 and bonded to the second surface (e.g. backside) 108 of the first die 102. The metal clip 120 can be bonded to the second surface 108 of the first die 102 by an adhesive in case the second surface 108 of the first die 102 is not electrically active i.e. all terminals are disposed at the first surface (e.g. front side) of the first die 102. Such an adhesive connection provides a thermal partway from the second surface 108 of the first die 102 to the structured metal redistribution layer 112. In the case of an electrically active backside i.e. one or more terminals disposed at the second surface of the first die 102, the metal clip 120 can be bonded to one or more of the terminals at the second surface 108 of the first 102 die by solder or other electrically conductive joining material, by advanced diffusion soldering, etc. Terminals are not shown at the second surface 108 of the first die 102 for ease of illustration. In each case, the metal clip 120 can be bonded to the second surface 108 of the first die 102 prior to embedding of the die 102 in the insulating material 104.

In general, part 122 of the metal clip 120 extends laterally beyond the edge 110 of the first die 102 and vertically in the first direction X toward the structured metal redistribution layer 112 to provide galvanic redistribution at the second surface 108 of the first die 102. The metal clip 120 can be realized by any standard clip forming process such as stamping, drawing, cutting, etching, etc. The metal clip 120 can at least partially replace standard wire-bond connections between the second surface 108 of the first die 102 and the structured metal redistribution layer 112 by a solid copper bridge, which can be soldered e.g. by solder paste. Such an embedded-chip package construction with embedded clip backside connection significantly increases the current (in the case of an electrically active backside of the die) and/or heat carrying capacity of the package 100.

The package 100 further comprises second conductive vias 124 connecting the structured metal redistribution layer 112 to the part 122 of the metal clip 120 that extends laterally beyond the edge 110 of the first die 102 and vertically toward the structured metal redistribution layer 112. The second conductive vias 124, like the first conductive vias 118, can be formed as part of any standard RDL process. The dimensions of the vias 118, 124 formed in the structured metal redistribution layer 112, including height, are limited by the particular RDL process being used. For thick dies, this means that the vias 118, 124 cannot extend vertically to the same level (L2) in the package 100 as the second surface (e.g. backside) 108 of the first die 102. As such, part 122 of the metal clip 120 extends laterally beyond the edge 110 of the first die 102 and vertically toward the structured metal redistribution layer 112 to enable contact with the second vias 124. In one embodiment, the part 122 of the metal clip 120 that extends laterally beyond the edge 110 of the die 102 and vertically in the first direction X toward the structured metal redistribution layer 112 has a surface 126 facing the structured metal redistribution layer 112 and which terminates at the same level (L1) within the insulating material 104 as the first surface 106 of the first die 102.

The package 100 can include more than one semiconductor die. For example, the semiconductor package 100 can further comprise a second semiconductor die 128 embedded in the insulating material 104 and spaced apart from the first die 102. The second die 128, like the first die 102, has a first surface 130 facing in the first direction X, a second surface 132 facing in the second (opposite) direction Y and an edge 134 extending between the first and second surfaces 130, 132. Third conductive vias 136 connect the structured metal redistribution layer 112 to terminals at the first surface 130 of the second die 128 to form a circuit connection between the dies 102, 128. For example, the dies 102, 128 can be high-side and low-side transistors, respectively, of a half-bridge circuit. Although not shown for ease of illustration, the package 100 can include a driver die for driving the gates (inputs) of the high-side and low-side transistors. Alternatively, the driver die can be omitted and instead provided in a separate package.

The part 122 of the metal clip 120 that extends laterally beyond the edge 110 of the first die 102 and vertically toward the structured metal redistribution layer 112 can be interposed between the first and second dies 102, 128 as shown in the multi-chip embedded package 100 of FIG. 1. A similar metal clip arrangement can be provided for the second die 128, which is not shown in FIG. 1 for ease of illustration. In general, such a multi-chip embedded power package 100 brings electrode and/or thermal contacts at the second surface (e.g. backside) 108, 132 of the power dies 102, 28 to the structured metal redistribution layer 112 using metal clips 120 without additional RDL integration requirements because the metal clips 120 can be pre-assembled and extend to the same level (L1) in the insulating material 104 as the first surface 106, 130 of the dies 102, 128.

In addition to the metal clip connections, some of the other connections in the package 100 optionally can be provided by wire bonds which are not shown for ease of illustration. The metal clip 120 and the first semiconductor die 102 can be provided as a pre-fabricated chip-clip type module with the metal clip 120 pre-bonded to the first die 102 prior to the chip-embedding process. The chip-embedded package 100 can have different redistribution wiring thicknesses, clip thicknesses and/or materials. For example, the redistribution wiring thickness can range from 1 µm to 1000 µm and the redistribution wiring and clip material can include Cu, Fe, Ni, Al, Au, Ag, Pt, Pd and their alloys. In one embodiment, the structured metal redistribution layer 112, the first conductive vias 118, the metal clip 120, the second conductive vias 124 and the third conductive vias 136 each comprise copper or a copper alloy.

Figure 2:
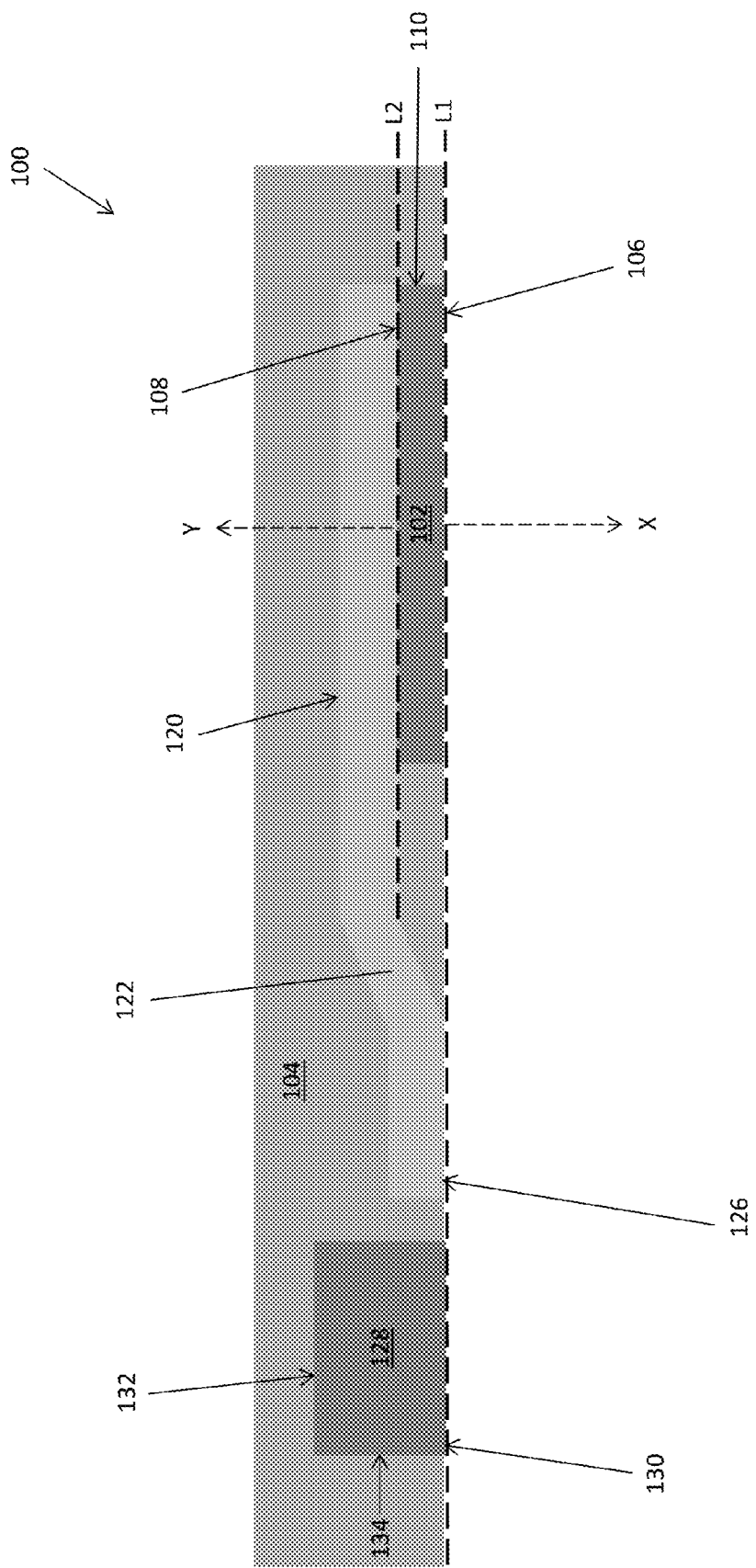
FIG. 2 illustrates a cross-sectional view of the chip-embedded semiconductor package shown in FIG. 1, according to an alternative embodiment.

FIG. 2 illustrates an alternative embodiment of the embedded-chip package 100 shown in FIG. 1. According to this embodiment, the structured metal redistribution layer 112 and corresponding conductive vias 118, 124, 136 are omitted from the package 100. The first surface 106, 130 of the semiconductor dies 102, 128, the part 122 of the metal clip 120 that extends laterally beyond the edge 110 of the die 102 and vertically in the first direction X and the bottom surface of the insulating material 104 can all terminate at the same level (L1) in the package 100 according to this embodiment. The first surface 106, 130 of the semiconductor dies 102, 128 and the bottom surface 126 of the part 122 of the metal clip 120 that extends laterally beyond the edge 110 of the die 102 and vertically in the first direction X are exposed i.e. uncovered by the insulating material according to this embodiment to facilitate external electrical connections.

Figure 3:
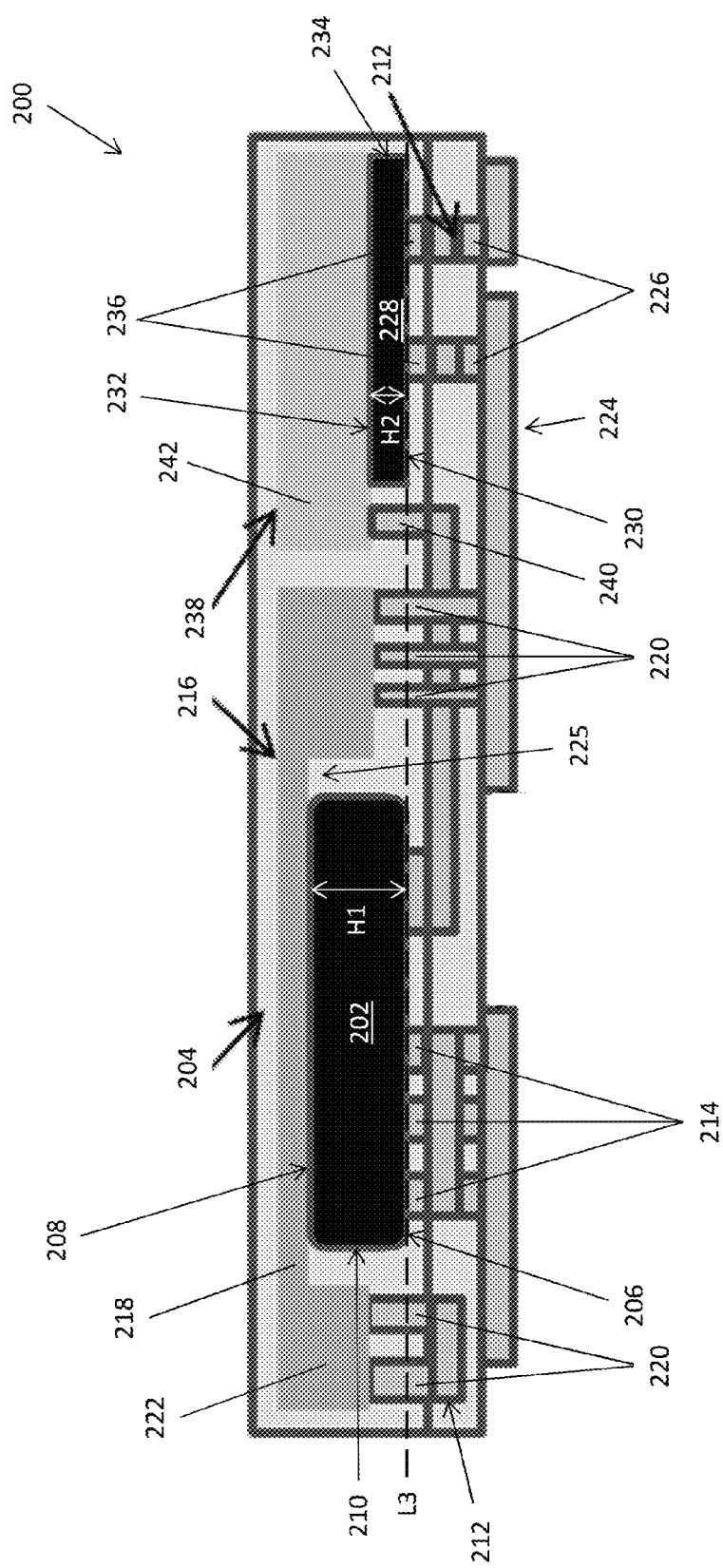
FIG. 3 illustrates a cross-sectional view of another embodiment of a chip-embedded semiconductor package.

FIG. 3 illustrates another embodiment of an embedded-chip package 200. According to this embodiment, the package 200 comprises a first semiconductor die 202 embedded in an insulating material 204. The insulating material 204 can be a laminate, molding compound, etc. as previously described herein. The first die 202 has opposing first and second surfaces 206, 208 and an edge 210 extending between the first and second surfaces 206, 208. A structured metal redistribution layer 212 e.g. of the kind previously described herein is disposed in the insulating material 204 below the first die 202. First conductive vias 214 connect the structured metal redistribution layer 212 to terminals at the first surface 206 of the first die 202. The die terminals are not shown for ease of illustration.

A first metal component 216 is embedded in the insulating material 204 above the first die 202 and bonded to the second surface 208 of the first die 202. The first metal component 216 is a metal lead frame according to this embodiment e.g. a Cu lead frame. Part 218 of the metal lead frame 216 extends laterally beyond the edge 210 of the first die 202 so that the lead frame 216 overhangs the first die 202.

The package 200 further comprises second conductive vias 220 extending vertically from the structured metal redistribution layer 212 toward the lead frame 216 and terminating prior to the lead frame 216 so that a gap exists between the second conductive vias 220 and the part 218 of the lead frame 216 extending laterally beyond the edge 210 of the first die 202.

The package 200 also includes a second metal component 222 disposed in the gap between the second conductive vias 220 and the part 218 of the first metal component 216 extending laterally beyond the edge 210 of the first die 202. The second metal component 222 connects the second conductive vias 220 to the part 218 of the first metal component 216 extending laterally beyond the edge 210 of the first die 202. The additional metal volume provided by the second metal component 222 provides significantly higher heat transition than other embedding materials such as epoxy mold compounds or laminates, enabling a double-sided cooling package with high conductive metal volume which can also support electrical functionality in the case of one or more terminals at the second surface (e.g. backside) 208 of the first die 202. For example the first metal component 216 can be electrically connected to a terminal at the second surface 208 of the first die 202, and the second metal component 222 and the second conductive vias 220 can collectively provide both a thermal pathway and an electrical pathway between the structured metal redistribution layer 212 and the first metal component 216.

Using the second metal component 222 to accommodate at least most of the height (H1) of the first die 202 also allows for the use of standard RDL technologies which have small via processes for the first redistribution layer 212. For example, standard RDL technologies typically allow for vias with a height of less than about 71 µm for the first redistribution layer. As such, relatively thick dies (>71 µm) can get assembled with this approach. Furthermore, increased heat dissipation is provided from the second surface 208 of the first die 202 into a board (not shown for ease of illustration) through the second metal component 222, the first redistribution layer 212 and a redistribution layer 224 on the board without an intermediary epoxy insulation layer in the direct heat path. The second metal component 222 also provides a high conductive metal volume as a substitute for low conductive laminate materials, and also accommodates different die and different lead frame thicknesses within the same package 200.

According to the embodiment of FIG. 3, the first metal component 216 and the second metal component 222 are of a single continuous construction. For example, the first metal component 216 and the second metal component 222 are part of the same metal lead frame. The lead frame 216, 222 includes a cavity or a recessed inner region 225 surrounded by a thicker outer region 222. The cavity/recessed region 225 can be formed by removing the lead frame material (e.g. copper) from the inner region 225 of the lead frame. The first die 202 is positioned in the inner cavity/recessed region 225 of the lead frame. The thicker outer part 222 of the lead frame connects the second conductive vias 220 to the thinner part 218 of the lead frame that extends laterally beyond the edge 210 of the die 202. The lead frame can be realized by any standard lead frame forming process such as stamping, drawing, cutting, etching, etc. In one embodiment, the structured metal redistribution layer 212, the first conductive vias 214, the first metal component 216, the second conductive vias 220, the second metal component 222, and any additional vias 226 of the package 200 each comprise copper or a copper alloy.

Further according to the embodiment of FIG. 3, the chip-embedded package 200 further comprises a second semiconductor die 228 embedded in the insulating material 204 and spaced apart from the first die 202. The first surface 206, 230 of both dies 202, 228 can be at the same level (L3) within the insulating material 204 of the package 200. The second metal component 222 can be laterally interposed between the first and second dies 202, 228 as shown in FIG. 3. Alternatively the second metal component 222 can be adjacent one of the dies 202, 208, but not laterally interposed between the first and second dies 202, 228.

In each case, the second die 228, like the first die 202, has opposing first and second surfaces 230, 232 and an edge 234 extending between the first and second surfaces 230, 232. Third conductive vias 236 connect the structured metal redistribution layer 212 to terminals (not shown for ease of illustration) at the first surface 230 of the second die 228. For example, the dies 202, 228 can be high-side and low-side transistors of a half-bridge circuit as previously described herein. Although not shown for ease of illustration, the package 200 can also include a driver die for driving the gates (inputs) of the high-side and low-side transistors. Alternatively, the driver die can be omitted and instead provided in a separate package.

Also according to the embodiment shown in FIG. 3, the thickness (H2) of the second die 228 is less than the thickness (H1) of the first die 202. A third metal component 238 embedded in the insulating material 204 above the second die 228 is bonded to the second surface 232 of the second die 228. In one embodiment, the third metal component 238 is a lead frame. The second and third metal components 222, 238 can be part of the same or different lead frames. For example, the second and third metal components 222, 238 can be formed from the same lead frame strip in which the cavity/recessed region 225 is also formed. Part of the third metal component 238 extends laterally beyond the edge 234 of the second die 228. Fourth conductive vias 240 extend vertically from the structured metal redistribution layer 212 and connect the structured metal redistribution layer 212 to a part 242 of the third metal component 238 that extends laterally beyond the edge 234 of the second die 228. The conductive vias 214, 220, 226, 240 of the package 200 can be formed as part of any standard RDL process.

Figure 4:
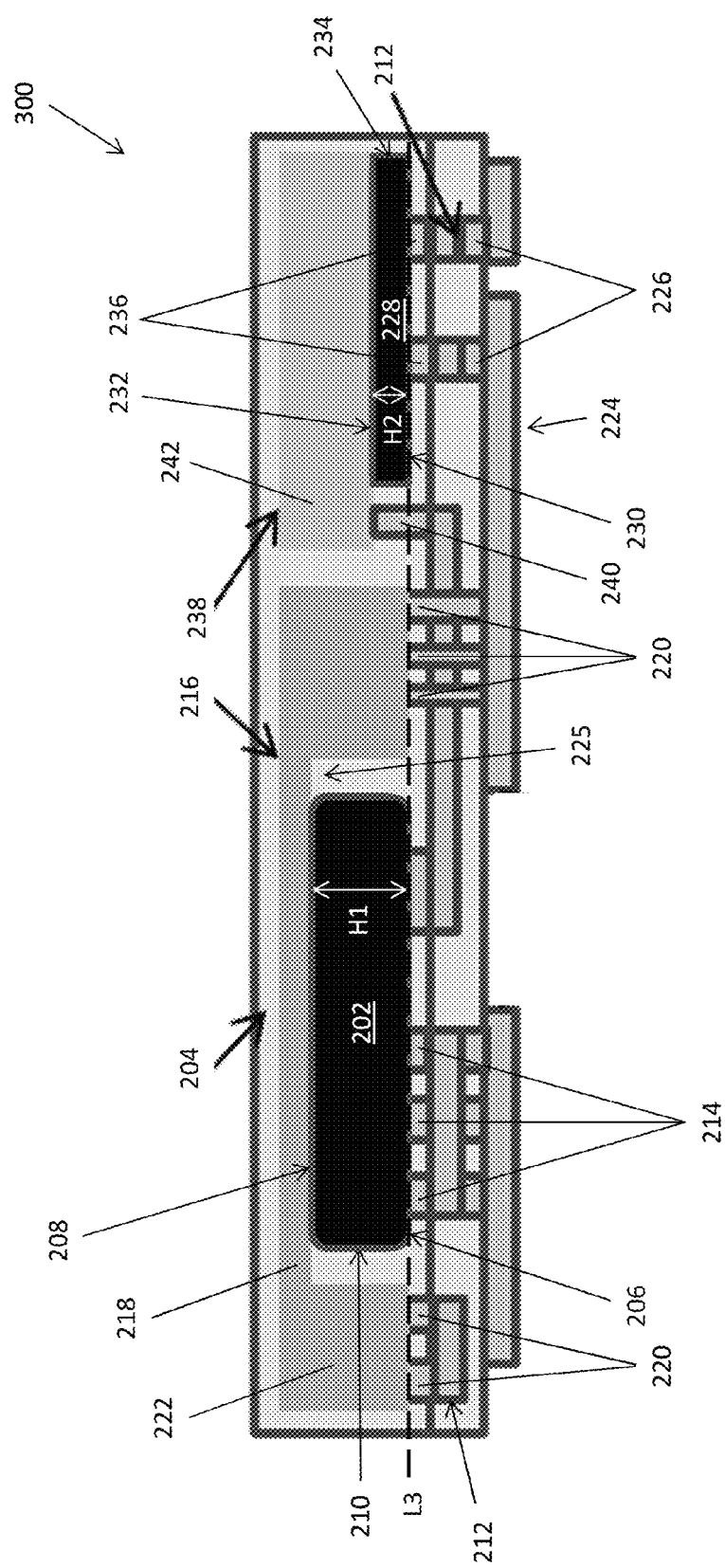
FIG. 4 illustrates a cross-sectional view of yet another embodiment of a chip-embedded semiconductor package.

FIG. 4 illustrates yet another embodiment of an embedded-chip package 300. The embodiment shown in FIG. 4 is similar to the one shown in FIG. 3, however, the second metal component 222 extends approximately to the same level (L3) in the insulating material 204 as the first surface 206 of the first die 202.

Figure 5:
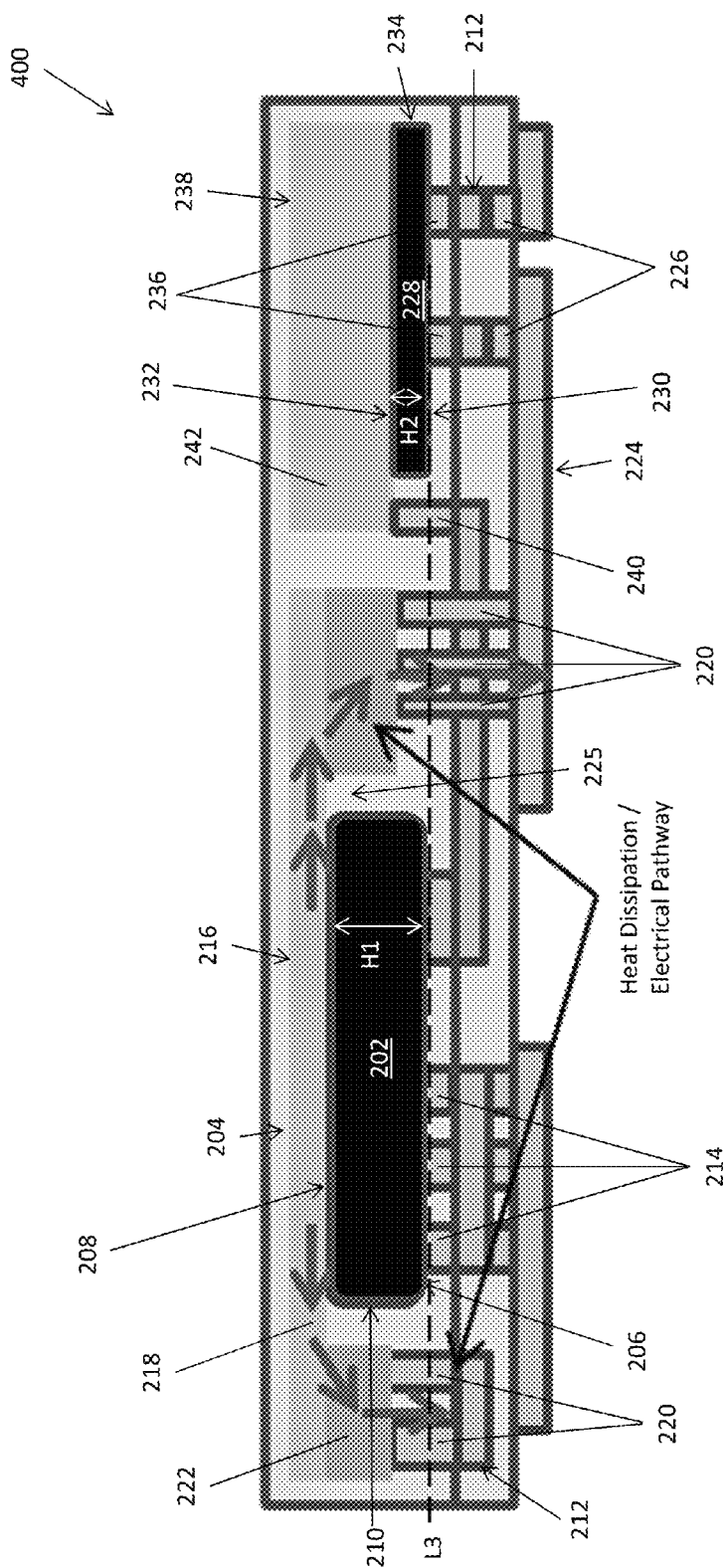
FIG. 5 illustrates a cross-sectional view of still another embodiment of a chip-embedded semiconductor package.

FIG. 5 illustrates yet another embodiment of an embedded-chip package 400. The embodiment shown in FIG. 5 is similar to the one shown in FIG. 3, however, the first metal component 216 is a metal lead frame having approximate uniform thickness and the second metal component 222 is a metal block. That is, the first and second metal components 216, 222 are separate and distinct from one another. The first and second metal components 216, 222 can be bonded to one another e.g. by an adhesive, solder, etc. and collectively provide a thermal path and optionally an electrical path from the second surface (e.g. backside) 208 of the second die 202 to the structured metal redistribution layer 212 as previously described herein. The heat dissipation and optional electrical pathway (if the second surface of the first die is electrically active) from the second surface 208 of the first die 202 to the structured metal redistribution layer 214 through the first and second metal components 216, 222 is shown in FIG. 5 with arrows. The heat dissipation path is devoid of an intermediary epoxy insulation layer in the direct heat path, as previously described herein.

Figure 6:
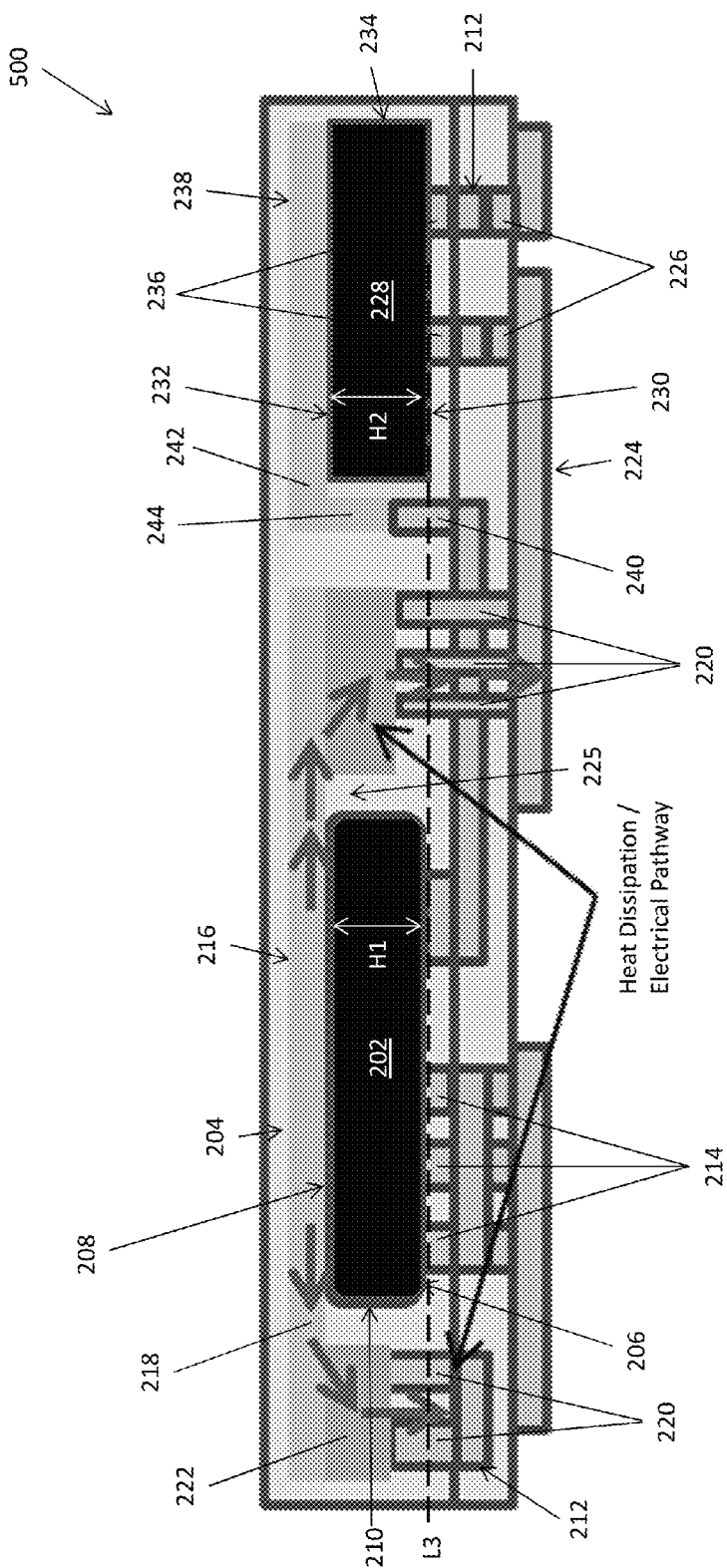
FIG. 6 illustrates a cross-sectional view of another embodiment of a chip-embedded semiconductor package.

FIG. 6 illustrates yet another embodiment of an embedded-chip package 500. The embodiment shown in FIG. 6 is similar to the one shown in FIG. 5, however, the first and second dies 202, 228 have approximately the same thickness (H1≈H2). That is, both dies 202, 228 are relatively thick e.g. thicker than about 71 μm and the fourth conductive vias 240 terminate prior to the third metal component 238 so that an additional gap exists between the fourth conductive vias 240 and the part 242 of the third metal component 238 extending laterally beyond the edge 234 of the second die 228. According to this embodiment, a fourth metal component 244 is disposed in the additional gap and connects the fourth conductive vias 240 to the part 242 of the third metal component 238 extending laterally beyond the edge 234 of the additional die 228. This way, standard RDL technologies with small via processes (e.g. having a height restriction of less than about 71 μm) for the first redistribution layer 212 can still be used. The third metal component 238 and the fourth metal component 244 are of a single continuous construction such as a metal lead frame according to the embodiment shown in FIG. 6.

Figure 7:
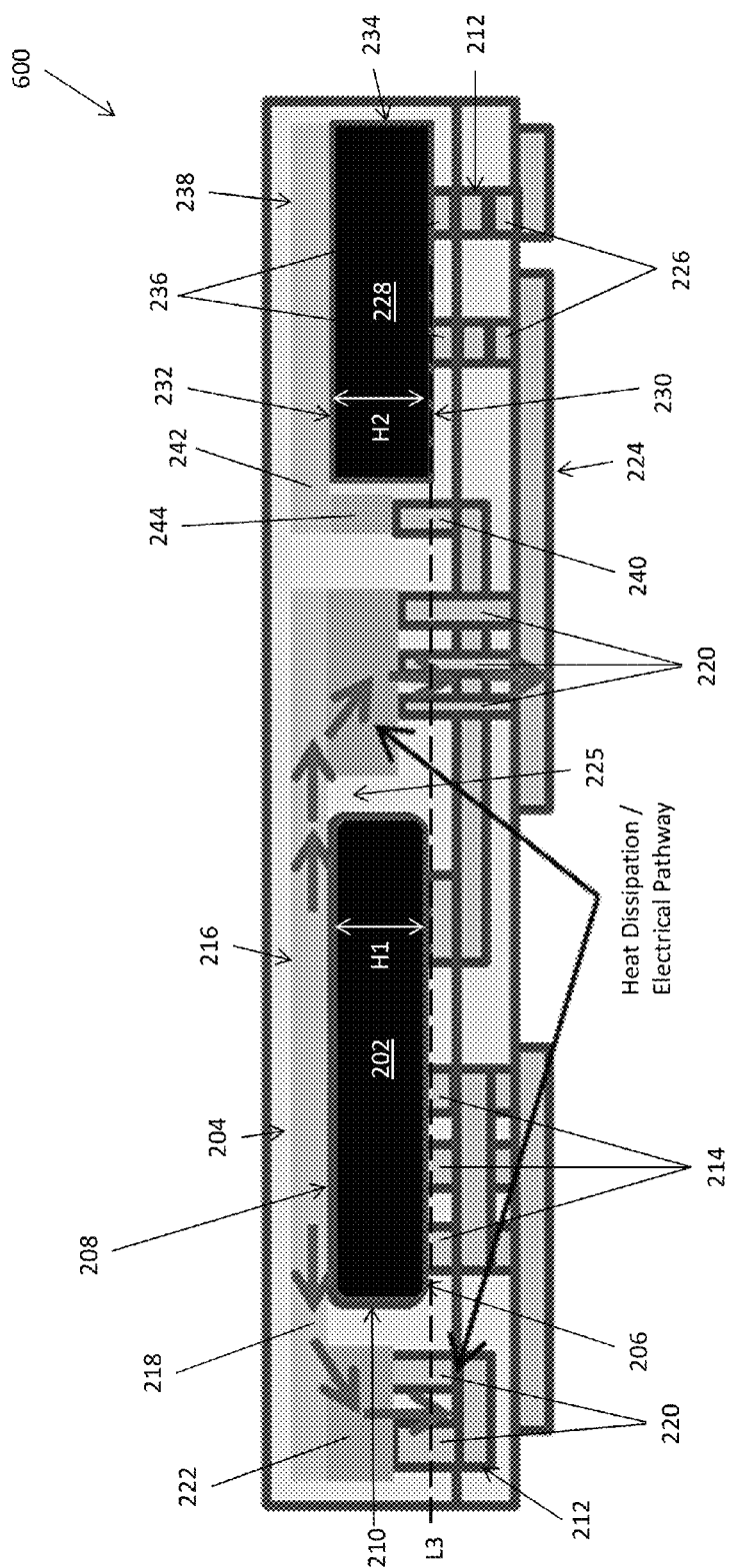
FIG. 7 illustrates a cross-sectional view of yet another embodiment of a chip-embedded semiconductor package.

FIG. 7 illustrates still another embodiment of an embedded-chip package 600. The embodiment shown in FIG. 7 is similar to the one shown in FIG. 6, however, the third and fourth metal components 238, 244 are separate and distinct from one another. For example, the third metal component 238 can be a metal lead frame having approximate uniform thickness and the fourth metal component 244 can be a metal block. The third and fourth metal components 238, 244 can be bonded to one another e.g. by an adhesive, solder, etc. and collectively provide a thermal path and optionally an electrical path from the second surface (e.g. backside) 232 of the second die 228 to the structured metal redistribution layer 212. The second and fourth metal components 222, 244 can extend to the same level (L3) in the insulating material 204 as the first surface 206, 230 of the dies 202, 228 as previously described herein, or extend to a different level in the insulating material 204 as shown in FIG. 7.

Figure 8:
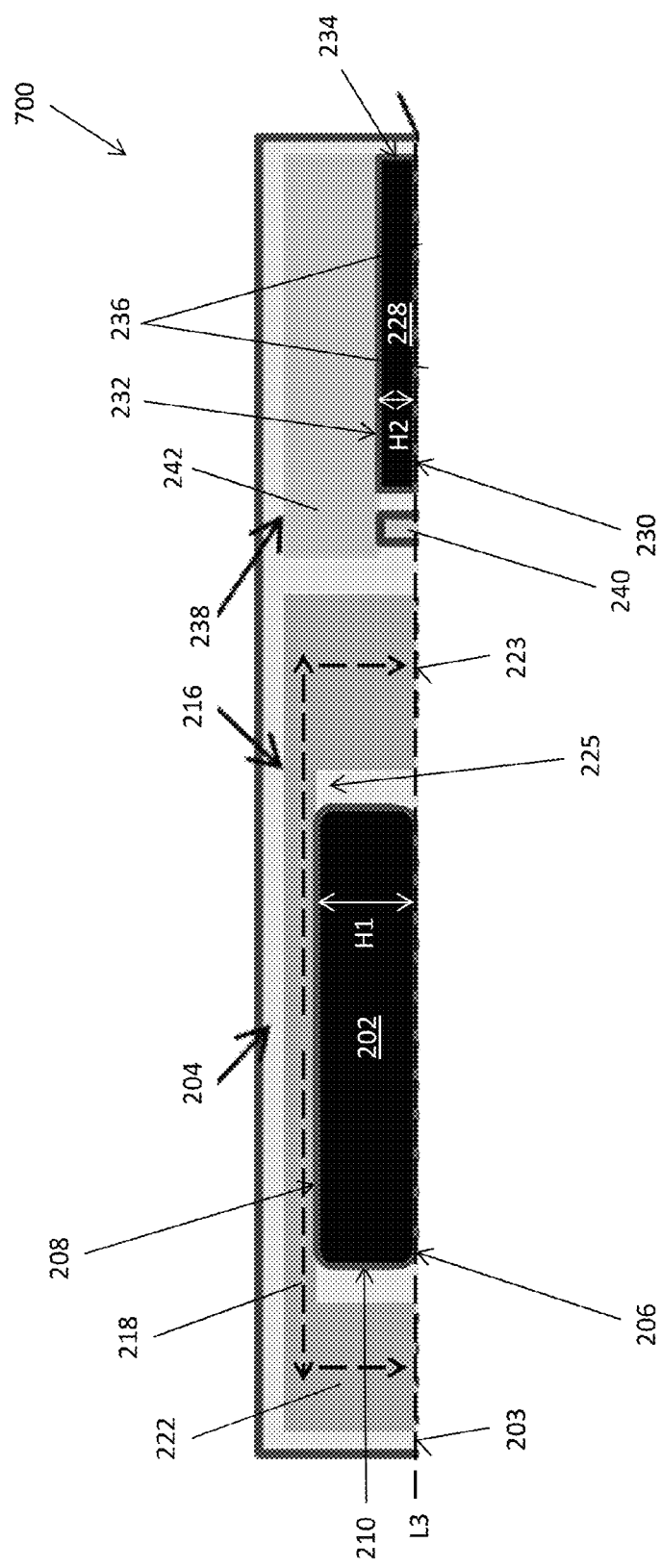
FIG. 8 illustrates a cross-sectional view of still another embodiment of a chip-embedded semiconductor package.

FIG. 8 illustrates another embodiment of an embedded-chip package 700. The embodiment shown in FIG. 8 is similar to the one shown in FIG. 4, however, the second metal component 222 vertically extends through the insulating material 204 to the exterior surface 203 of the insulating material 204 to provide at least a thermal pathway and also optionally an electrical pathway (if the backside of the first die 202 is electrically active) from the second surface 208 of the first die 202 to outside the package 700. This pathway includes a lateral part through the first metal component 216 and the part 218 of the metal lead frame 216 that extends laterally beyond the edge 210 of the first die 202 as indicated by the dashed horizontal lines in FIG. 8, and a vertical part through the second metal component 222 as indicated by the dashed vertical lines in FIG. 8. The dies 202, 228 can be over-molded so that the first surface 206 of the dies 202, 228 is covered by the insulating material 204. In either case, the bottom surface 223 of the second metal component 222 remains uncovered by the insulating material 204 to facilitate the thermal/electrical pathway described above. The first metal component 216 and the second metal component 222 can be of a single continuous construction (e.g. a single lead frame) or of different constructions (e.g. a lead frame and separate metal block), both as previously described herein.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
    a semiconductor die embedded in an insulating material, the die having a first surface facing in a first direction, a second surface facing in a second direction opposite the first direction and an edge extending between the first and second surfaces;
    a structured metal redistribution layer disposed in the insulating material below the die; and
    a metal clip embedded in the insulating material above the die and bonded to the second surface of the die,
    wherein part of the metal clip extends laterally beyond the edge of the die and vertically in the first direction to provide galvanic redistribution at the second surface of the die,
    wherein the structured metal redistribution layer is connected to terminals at the first surface of the die and connected to the part of the metal clip that extends laterally beyond the edge of the die and vertically in the first direction toward the structured metal redistribution layer.

2. The semiconductor package of claim 1, further comprising:
    first conductive vias connecting the structured metal redistribution layer to the terminals at the first surface of the die; and
    second conductive vias connecting the structured metal redistribution layer to the part of the metal clip that extends laterally beyond the edge of the die and vertically in the first direction toward the structured metal redistribution layer.

3. The semiconductor package of claim 1, wherein the structured metal redistribution layer and the metal clip comprise copper or a copper alloy.

4. The semiconductor package of claim 2, further comprising:
    an additional semiconductor die embedded in the insulating material and spaced apart from the other die, the additional die having a first surface facing in the first direction, a second surface facing in the second direction and an edge extending between the first and second surfaces; and
    third conductive vias connecting the structured metal redistribution layer to terminals at the first surface of the additional die.

5. The semiconductor package of claim 4, wherein the part of the metal clip that extends laterally beyond the edge of the die and vertically in the first direction toward the structured metal redistribution layer is interposed between the die and the additional die.

6. The semiconductor package of claim 1, wherein the insulating material is a laminate or a molding compound.

7. The semiconductor package of claim 1, wherein the part of the metal clip that extends laterally beyond the edge of the die and vertically in the first direction terminates at the same level within the insulating material as the first surface of the die.

8. A semiconductor package, comprising:
    a semiconductor die embedded in an insulating material, the die having opposing first and second surfaces and an edge extending between the first and second surfaces;
    a structured metal redistribution layer disposed in the insulating material below the die;
    first conductive vias connecting the structured metal redistribution layer to terminals at the first surface of the die;
    a first metal component embedded in the insulating material above the die and bonded to the second surface of the die, part of the first metal component extending laterally beyond the edge of the die;
    second conductive vias extending vertically from the structured metal redistribution layer toward the first metal component and terminating prior to the first metal component so that a gap exists between the second conductive vias and the part of the first metal component extending laterally beyond the edge of the die; and
    a second metal component disposed in the gap and connecting the second conductive vias to the part of the first metal component extending laterally beyond the edge of the die.

9. The semiconductor package of claim 8, wherein the structured metal redistribution layer, the first conductive vias, the first metal component, the second conductive vias and the second metal component each comprise copper or a copper alloy.

10. The semiconductor package of claim 8, wherein the insulating material is a laminate or a molding compound.

11. The semiconductor package of claim 8, wherein the second metal component extends to the same level in the insulating material as the first surface of the die.

12. The semiconductor package of claim 8, wherein the first metal component and the second metal component are of a single continuous construction.

13. The semiconductor package of claim 12, wherein the first metal component and the second metal component are part of a metal lead frame.

14. The semiconductor package of claim 8, wherein the first metal component is a metal lead frame and the second metal component is a metal block.

15. The semiconductor package of claim 8, further comprising:
    an additional semiconductor die embedded in the insulating material and spaced apart from the other die, the additional die having opposing first and second surfaces and an edge extending between the first and second surfaces; and
    third conductive vias connecting the structured metal redistribution layer to terminals at the first surface of the additional die.

16. The semiconductor package of claim 15, wherein the additional die is thinner than the other die, the semiconductor package further comprising:

a third metal component embedded in the insulating material above the additional die and bonded to the second surface of the additional die, part of the third metal component extending laterally beyond the edge of the additional die; and fourth conductive vias extending vertically from the structured metal redistribution layer and connecting the structured metal redistribution layer to the part of the third metal component that extends laterally beyond the edge of the additional die.

17. The semiconductor package of claim 15, further comprising:

a third metal component embedded in the insulating material above the additional die and bonded to the second surface of the additional die, part of the third metal component extending laterally beyond the edge of the additional die; and fourth conductive vias extending vertically from the structured metal redistribution layer toward the third metal component and terminating prior to the third metal component so that an additional gap exists between the fourth conductive vias and the part of the third metal component extending laterally beyond the edge of the additional die; and a fourth metal component disposed in the additional gap and connecting the fourth conductive vias to the part of the third metal component extending laterally beyond the edge of the additional die.

18. The semiconductor package of claim 15, wherein the second metal component is interposed between the die and the additional die.

19. The semiconductor package of claim 8, wherein the first metal component is electrically connected to a terminal at the second surface of the die, and wherein the second metal component and the second conductive vias provide both a thermal pathway and an electrical pathway between the structured metal redistribution layer and the first metal component.

20. A semiconductor package, comprising:

a semiconductor die embedded in an insulating material, the die having opposing first and second surfaces and an edge extending between the first and second surfaces;

a structured metal redistribution layer disposed in the insulating material below the die;

a first metal component embedded in the insulating material above the die and bonded to the second surface of the die, part of the first metal component extending laterally beyond the edge of the die; and a second metal component disposed under and connected to the part of the first metal component that extends laterally beyond the edge of the die, the second metal component vertically extending through the insulating material so that part of the second metal component is uncovered by the insulating material at a side of the package facing away from the second surface of the die, wherein the first and second metal components form at least a thermal pathway from the second surface of the die to the side of the package facing away from the second surface of the die.

* * * * *